United States Patent [19]
Ting et al.

[11] Patent Number: 5,754,479
[45] Date of Patent: May 19, 1998

[54] DISTRIBUTED BIT SWITCH LOGICALLY INTERLEAVED FOR BLOCK WRITE PERFORMANCE

[75] Inventors: Tah-Kang Joseph Ting; Yung-Ching Hsieh, both of Hsinchu; Chun Shiah, Taichung, all of Taiwan

[73] Assignee: Etron Technology, Inc., Hsin-Chu, Taiwan

[21] Appl. No.: 808,268

[22] Filed: Feb. 28, 1997

[51] Int. Cl.$^6$ .................................................. G11C 7/00
[52] U.S. Cl. .............................. 365/189.01; 365/230.03; 365/63
[58] Field of Search ................... 365/230.03, 189.01, 365/63, 52

[56] References Cited

U.S. PATENT DOCUMENTS 5,267,196  11/1993  Talreja et al. ............... 365/230.03
5,663,923   9/1997  Baltar et al. ................ 365/230.03

Primary Examiner—Vu Anh Le
Attorney, Agent, or Firm—George O. Saile; Stephen B. Ackerman

[57] ABSTRACT

The invention describes a technique in which the performance of a block write operations for SGRAM and VRAM are improved. The technique also produces improved noise margin along the data line when connecting to bit switches under mask during block write operation. The technique rearranges the physical location of each bit switch located along the data lines such that the worse case configuration is not clustered at the end of the data lines during a block write operation. This reduces the voltage drop along the data lines and provides more energy to switch bit lines or the corresponding memory columns. It also produces less drop on the bit lines as a result of doing a mask during the block write operation.

20 Claims, 7 Drawing Sheets

| Phys. | L-grp 1 | L-grp 2 | L-grp 3 | ...... | L-grp 7 | L-grp 8 |
|---|---|---|---|---|---|---|
| BS0 | BS0 | | | | | |
| BS1 | | BS1 | | | | |
| BS2 | | | BS2 | | | |
| . | . | . | . | ...... | . | . |
| . | . | . | . | ...... | . | . |
| BS6 | | | | | BS6 | |
| BS7 | | | | | | BS7 |
| BS8 | BS8 | | | | | |
| BS9 | | BS9 | | | | |
| BS10 | | | BS10 | | | |
| . | . | . | . | ...... | . | . |
| . | . | . | . | ...... | . | . |
| BS14 | | | | | BS14 | |
| BS15 | | | | | | BS15 |
| BS16 | BS16 | | | | | |
| . | . | . | . | ...... | . | . |
| . | . | . | . | ...... | . | . |
| . | . | . | . | ...... | . | . |
| BS248 | BS248 | | | | | |
| BS249 | | BS249 | | | | |
| BS250 | | | BS250 | | | |
| . | . | . | . | ...... | . | . |
| . | . | . | . | ...... | . | . |
| BS254 | | | | | BS254 | |
| BS255 | | | | | | BS255 |

*FIG. 4*

DISTRIBUTED BIT SWITCH LOGICALLY INTERLEAVED FOR BLOCK WRITE PERFORMANCE

BACKGROUND OF THE INVENTION

1. Field of Invention

This invention relates to synchronous graphics random access memory (SGRAM) and in particular improving performance for block write operations.

2. Description of Related Art

An important function in graphics memory operations, such as SGRAM and VRAM (video random access memory) is the ability to write a single data value to a consecutive set of memory columns. This allows for window clearing and color fill at a speed considerably faster than if the function was performed in a standard DRAM (dynamic random access memory) a column at a time. Even so, with the growth in the amount of graphics, colors, density and size, there exists a continuing need to perform the memory block write function at a faster speed, and included in this is the ability to perform masking operations.

In U.S. Pat. No. 5,305,278 (Inoue) describes a memory device having block write capability. This invention describes a means for performing a block write operation in a random access memory so designed to perform the function. It does not describe any performance enhancements beyond the performance gain that is realized by doing a block write. In U.S. Pat. No. 5,392,241 (Butler et al.) is described a block over write technique utilizing a primary and secondary set device that allows a block write greater than eight bits. In U.S. Pat. No. 5,559,749 (McLaury) is described a multi-bit write register which has a plurality of bits to form a block during a block write. Each memory cell connected to the multi-bit write register can be block written at the same time.

With the onset of 3-D graphics, virtual reality and the likes, it is important to provide block write operation along with any masking operations reliably and as fast as possible. This could take the form of faster chips, but it is laced with additional complexities including power and cost. Writing more than eight bits simultaneously may not fill all needs efficiently, and an approach that improves the internal speed of the block write operation is needed that does not tax the other functions in a graphics memory operation.

A bit switch is a two CMOS transistor device in which the two gates are connected together and to memory addressing circuitry. The source of each device is connected to a differential data line. One connected to DL (data line) and the other connected to DLB (data line bar). The respective drains of the two CMOS transistors are connected to BL (bit line) and BLB (bit line bar) of a memory column. In a write cycle a bit switch, when activated by a memory address, transfers data from the differential data line to the differential bit lines of the memory columns and the sense amplifiers connected to the bit lines. There is one bit switch connected to every memory column. The bit switches are connected to a data line starting at a point near the data line driver and continuing to a far end point of the data line. The address of the bit switches, and therefore the memory columns, are typically assigned in sequence from the bit switch closest to the data line driver to last bit switch along the data lines.

When a block write is performed a number of consecutive bit switches are activated and the same data from the data line is written onto a number of consecutive memory sense amplifiers and memory columns. The number of consecutive bit switches connecting data lines to memory columns can vary but eight is common for a block write. The number of consecutive bit switches for a block write could be higher or lower than eight in different implementations. The worse case configuration is when all the selected consecutive bit switches occupy the last bit switch locations along the data lines furthest from the data line driver. All of the current drawn by the consecutive bit switches will flow through all of the resistance of the data lines up to the active bit switches causing a voltage drop that takes away from the charging of the line capacitance and switching of the sense amplifiers. This in turn limits the performance of the block write operation.

SUMMARY OF THE INVENTION

This invention describes a technique in which the bit switches are logically distributed along the data lines in such a way as to minimize the worse case data line voltage drop. Thus improving the performance of the block write operation. The bit switches are first grouped into "n" groups containing "m" bit switches where "n" is equal to the number of bit switches that are activated simultaneously to perform a block write and where n×m=(number of memory columns). The focus of this invention will be a two-hundred-fifty-six column memory and a block write of eight consecutive memory columns resulting in n=8 groups of m=32 bit switches. The technique presented is applicable to other combinations of the number of memory columns and the number consecutive columns in a block write.

Each group is connected to the data lines in sequence starting with the first group containing bit switch addresses BS0, BS8, BS16, BS24, . . . , BS248, then the second group containing bit switch addresses BS1, BS9, BS17, BS25, . . . , BS249 and so on until the last group is connected which contains addresses BS7, BS15, BS23, BS31, . . . , BS255. In this way each logical group is formed by interleaving the assignment of the bit switch address into the different groups.

Before logically grouping the bit switches, the worse case configuration of eight consecutive bit switches was BS248, BS249, BS250, . . . , BS254, and BS255. These were the last eight bit switches physically located at the far end of the data lines from the data line driver in bit switch physical locations L248, L249, L250, . . . , L254, AND L255. This resulted in all of the current being drawn by the bit switches flowing through the data line resistance between the data line driver and L248, and dropping off from L248 to the end of the line as each bit switch takes its share. The resulting voltage drop from all of the bit switch signal current flowing through most of the data line resistance reduced the capability of the data line driver to drive line capacitance. With the logical grouping of bit switches into eight interleaved groups, the worse case bit switch address is still BS248, BS249, BS250, . . . , BS254, BS255, but the physical location of these bit switches has become L31, L63, L95, . . . , L223, AND L255. The result of this physical location is improved block write performance and improved noise margin for masking operations. This is a direct result of the lowered voltage drop across line resistance, providing more voltage to operate the circuits.

The distribution of bit switches described herein can be accomplished by addressing means in which bit switch control signals are logically connected to bit switches in different physical locations. The redistribution can also be done by physically re-routing the control lines from the address circuitry to the various bit switches. A combination of physical and logical routing of control lines from the addressing circuitry to the bit switches may also provide a useful way to implement the technique of this invention.

There are other means that might be appropriate to be used to reduce the effects of bit line resistance on block write operations. This includes forming a data line configuration different than a single segment pair running from the data line driver to the last bit switch. This different data line configuration might take the shape of a star configuration where each differential element of the star configuration connects to fewer bit switches and has a shorter length than the single segment pair. Also combining a star like configuration with a logical distribution of bit switches could have the potential of further reducing data line resistance effects.

BRIEF DESCRIPTION OF THE DRAWINGS

This invention will be described with reference to the accompanying drawings, wherein:

FIG. 4 is a table the interleaving of table bit switch addresses into eight logical groups.

DETAILED DESCRIPTION OF THE PREFERRED EMBODIMENT

Figure 1:
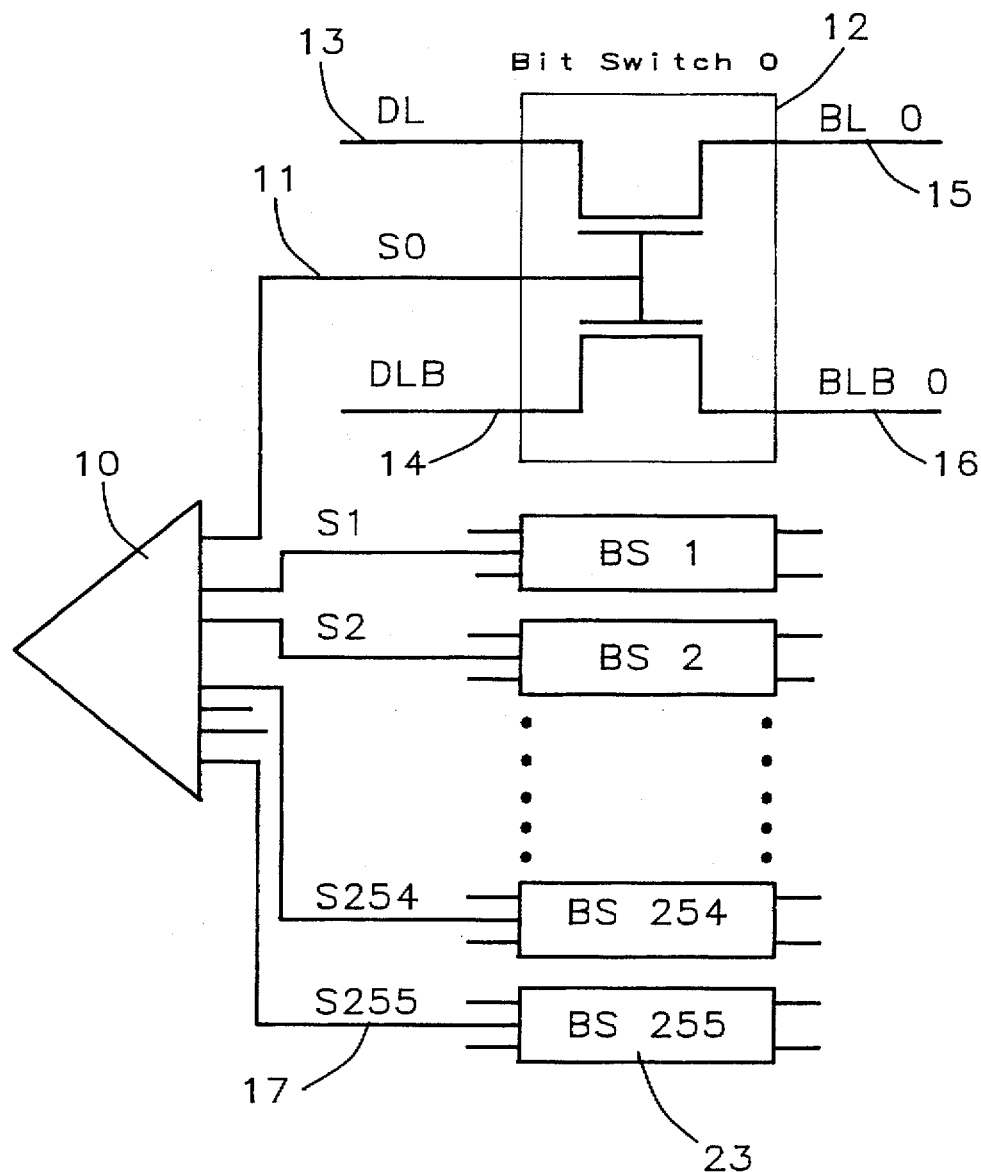
FIG. 1 shows the connection of addressing circuitry to bit switches in prior art.
Figure 2:
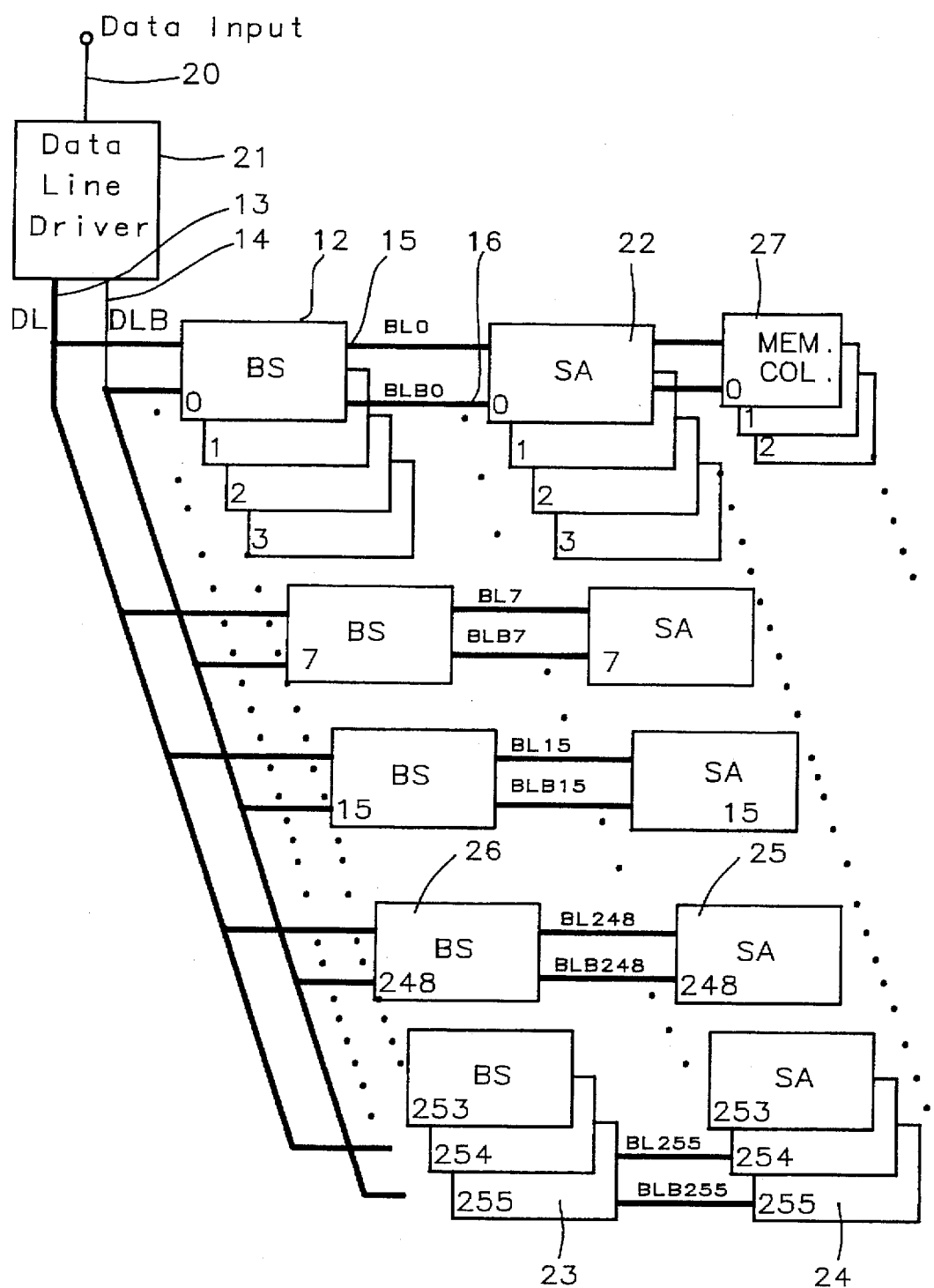
FIG. 2 shows bit switches connected between data lines and bit lines in prior art.

In FIG. 1 is shown the prior art connection of address circuitry 10 to bit switch (BS) 12 by means of control line 11 through 17 (S0 through S255). Each bit switch 12 having a connection to the same data line (DL) 13 and the same data line bar (DLB) 14, shown only in the expanded view of the bit switch (BS0) 12. Each bit switch 12 is connected to a different differential pair of bit lines represented by bit line zero (BL0) 15 and bit line bar zero (BLB0) 16. These bit lines 15 16 connect to a memory column where each bit switch 12 connects to a different memory column. There are two-hundred and fifty-six bit switches (BS0 through BS255) 12 23 corresponding to the same number of different memory columns and bit lines 15 16. FIG. 2 shows the data connections for the prior art of FIG. 1. The bit switches 12, in FIG. 2, are connected to the DL 13 and the DLB 14 of the output of the data line driver 21. The data line driver takes its input from data input 20. Each bit switch is connected in a physical sequence to the data lines, DL 13 and DLB 14, starting with bit switch (BS0) 12 at a point near the data line driver 21 and continuing in sequence to bit switch (BS255) 23. Each bit switch 12 is connected to a different bit line (BL) 15 and bit line bar (BLB) 16 which in turn connects to memory columns 27 and sense amplifiers (SA) 22. The bit lines 15 16, sense amplifiers 22, and memory columns 27 follow the same address identification as the bit switches 12 in sequential order similar to the physical connection of the various bit switches 12 to DL 13 and DLB 14.

Figure 3:
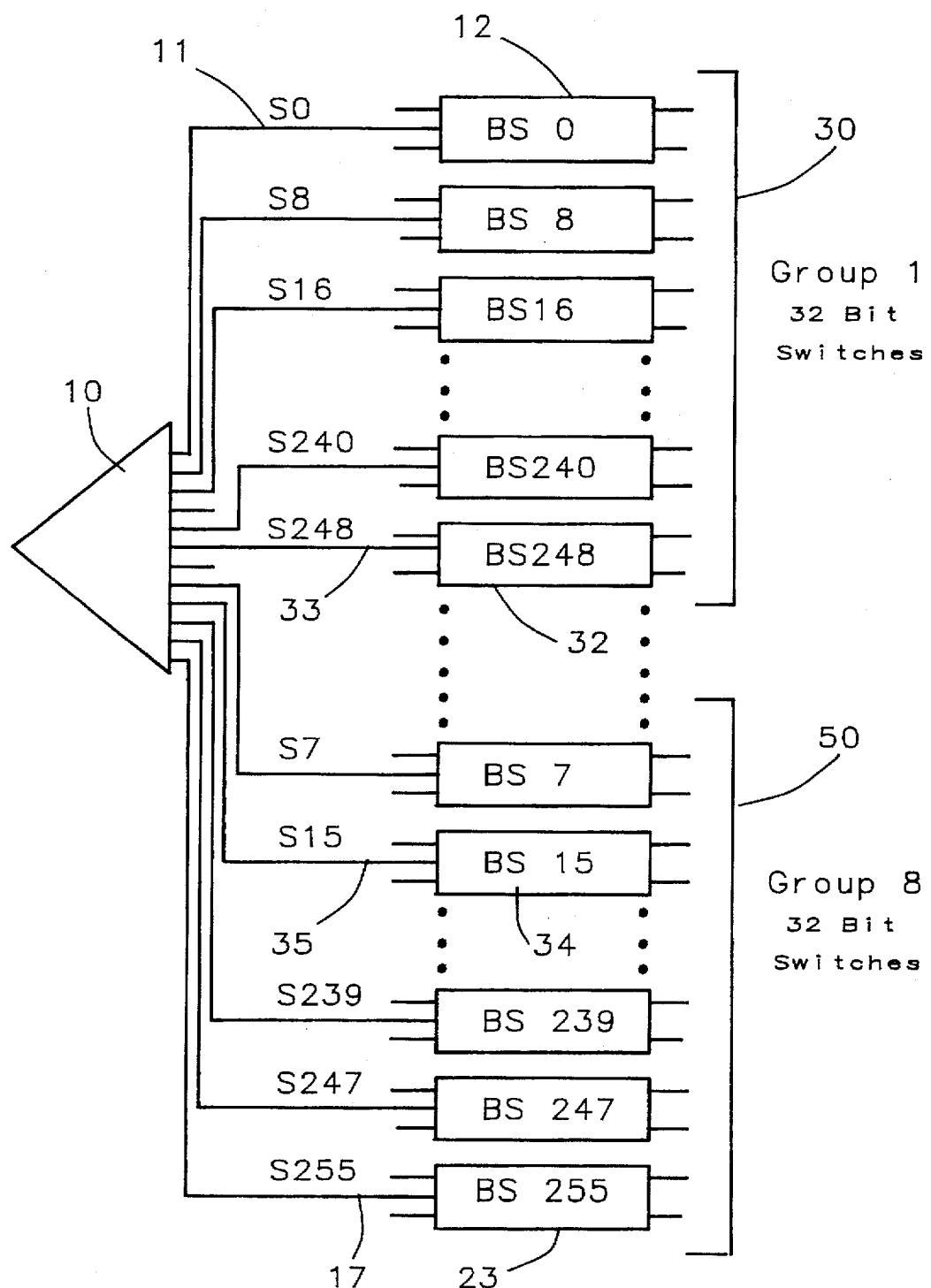
FIG. 3 shows a logical grouping of bit switches connected to addressing circuitry.

Referring to FIG. 3, the control lines 11 are shown for a logical distribution of bit switches 12. The designation of the control lines 11 connected to the addressing circuitry 10 is different than shown in FIG. 1. There are two-hundred and fifty-six memory columns denoted by the highest bit switch address (BS255) 23. The two-hundred and fifty-six bit switches are distributed into eight groups 30 50, each containing thirty two bit switches 12. The control lines 11 are distributed from the addressing circuitry 10 in the same fashion as the bit switches 12. For example; bit switch (BS248) 32 which is in group one 30 continues to receive control signal (S248) 33 as does bit switch (BS15) 34 in group eight 50 continues to receive control signal (S15) 35. All bit switches 12 receive the same control signal as before being grouped into groups one 30 through eight 50. The difference is the physical location along the data lines DL 13 and DLB 14 of the logically distributed bit switches.

Figure 5:
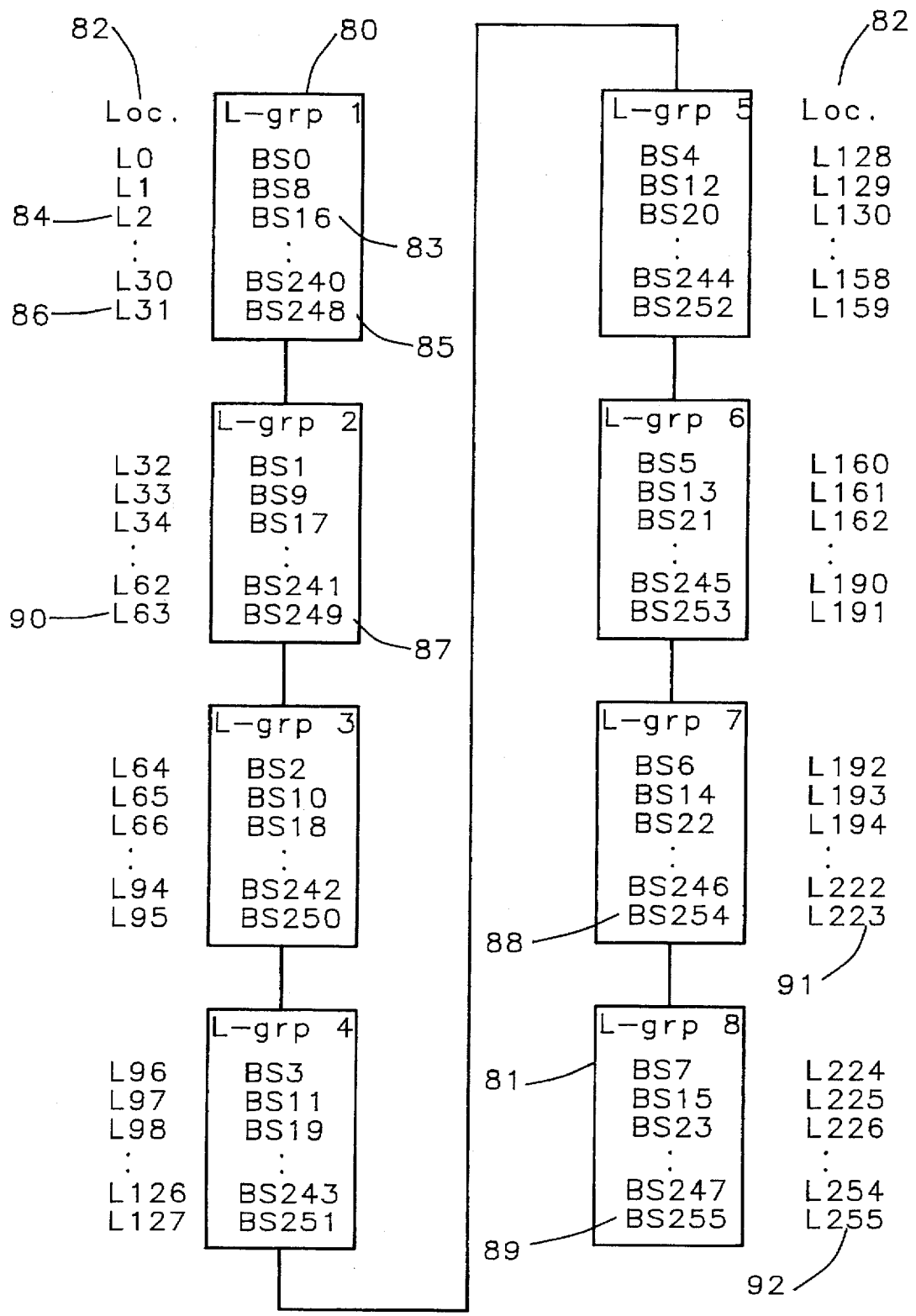
FIG. 5 shows the relationship between bit switch physical location and bit switch addresses in logical groups.

In FIG. 4 is shown a table that relates the logical distribution of bit switch addresses into groups to the physical addresses prior to the logical distribution. The column titled "Phys" is the physical bit switch addresses similar to those shown in FIG. 1 and FIG. 2 for prior art. The columns titled "L-grp 1" through "L-grp 8" show how each logical group of bit switches is formed in relationship to the physical sequence of bit switches. Into each logical group, "L-grp 1" through "L-grp 8" is placed one of the first eight bit switch addresses starting with BS0 in "L-grp 1" and ending with BS7 in "L-grp 8". Then the second eight bit switch addresses are placed into each logical group starting with BS8 in "L-grp 1" and ending with BS15 in "L-grp 8". This continues until the last eight bit switch addresses are distributed into each group starting with BS248 in "L-grp 1" and ending with BS255 in "L-grp 8". Thus the logical groups, "L-grp 1" through "L-grp 8" form a set of interleaves into which thirty-two bit switch addresses are placed. In FIG. 5 is shown how each logical group 80 of bit switches is sequenced along the data lines. Logical group one (L-grp 1) 80 being the first group in the sequence of groups along the data lines and logical group eight (L-grp 8) 81 being the last group in the sequence. Beside each group 80 is the physical bit switch location 82 along the data lines. For instance, the bit switch within group one (L-grp 1) 80 that is addressed as (BS16) 83 is physically located at (L2) 84. Bit switch (BS248) 85 located as the two hundred forty eighth bit switch in the prior art of FIGS. 1 and 2 is redistributed to be located at the thirty second bit switch location (L31) 86. When a block write of the last eight bit switches is performed, bit switches (BS248) 85, (BS249) 87, . . . , (BS254) 88, and (BS255) 89 are selected and are located at (L31) 86, (L63) 90, . . . , (L223) 91 and (L255) 92. This demonstrates the distribution of eight consecutive bit switch addresses along the data lines, and all other combinations of eight consecutive bit switch addresses will have a similar distribution.

Figure 6:
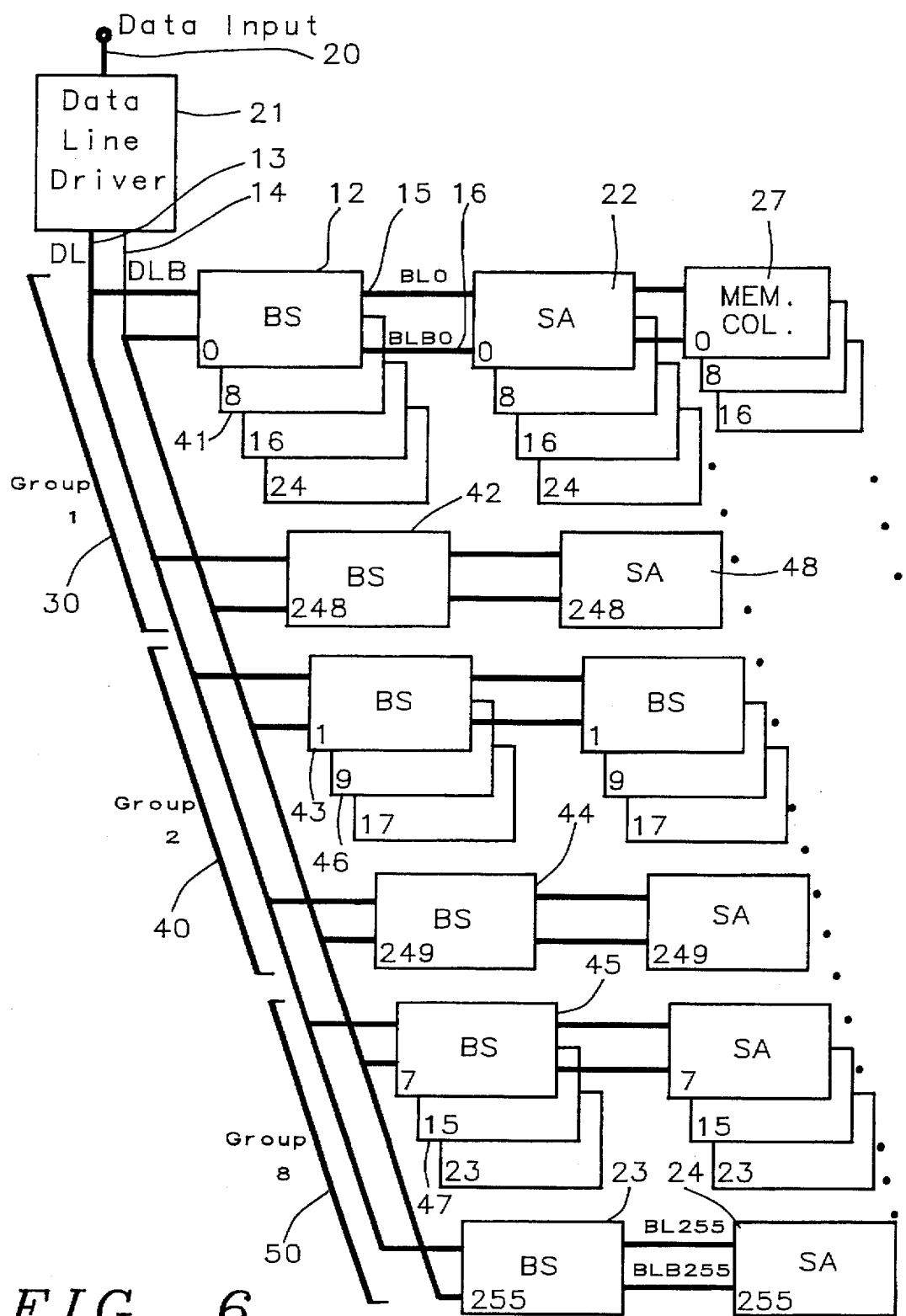
FIG. 6 shows logical groupings of bit switches connected between data lines and bit lines.

In FIG. 6 is shown the data connections for the distributed bit switches along DL 13 and DLB 14 which are the output of the data line driver 21. Shown in FIG. 6 are three of the eight groups 30, 40, and 50 each containing thirty-two data switches. The first group 30 connected closest to the data line driver 21 contains bit switch (BS0) 12 which is the first physically connected bit switch to DL 13 and DLB 14. The next physically connected bit switch is designated as (BS8) 41. The last bit switch in group one 30 to be connected to DL 13 and DLB 14 is designated (BS248) 42 which is the thirty second bit switch connected to the data lines 13 14. Before logically re-ordering bit switches into groups, bit switch (BS248) 42 was the two-hundred forty-ninth bit switch connected to the data lines 13 14. After re-ordering, bit switch (BS248) 42 is the thirty-second bit switch connected to the data lines 13 14. This is a considerable improvement in the location of bit switch (BS248) 42 along the data lines 13 14 and a substantial reduction in the amount of resistance between the data line driver and the location of the bit switch (BS248) 42.

Continuing to refer to FIG. 6, the second group 40 of thirty-two bit switches is next connected to the DL 13 and DLB 14 following group one 30. The first connected bit switch in the second group 40 is (BS1) 43. The last connected bit switch in group two 40 is (BS249) 44 which is thirty-two bit switch positions further from the data line driver 21 that the first bit switch 43 in group two 40. The last group to be connected to the data lines 13 14 is group eight. Group eight starts with bit switch (BS7) 45 and ends with bit switch (BS255) 23. As can be seen from FIG. 4 each group 30 40 50 starts with one of the first eight physically connected bit switches 12 43 45 and ends with one of the last eight physically connected bit switches 42 44 23. Each bit switch assigned to each group 30 40 50 is eight addresses from the previous bit switch as denoted by location of bit switch (BS8) 41, bit switch (BS9) 46 and bit switch (BS15) 47 in comparison with (BS0) 12, (BS1) 43 and (BS7) 45. Every eighth bit switch address is assigned to each group 30 40 50 starting with the first bit switch 12 43 45 until the thirty-second bit switch in each group is reached, denoted by bit switch (BS248) 42, bit switch (BS249) 44 and bit switch (BS255) 23.

Each bit switch in FIG. 6 is similarly connected to sense amplifiers 22 and memory columns 27 through a bit line (BL) 15 and a bit line bar (BLB) 16. The designation of these bit lines 15 16 is not shown for the remainder of the bit lines to reduce the congestion of FIG. 6, but as can be seen the bit lines 15 16, the sense amplifiers (SA) 22 and memory columns 27 carry a similar designation to the bit switches as represented by (BS0) 12 and (BS255) 23. Thus the logical location of the bit switches, sense amplifiers and memory columns as represented by sense amplifier (SA248) 48 and the physical location represented by sense amplifier (SA248) 25 shown in FIG. 2 are not necessarily the same. It is this difference in logical and physical locations of the bit switches 12 along the bit lines that permits the improvement in data line 13 14 voltage drop.

In the prior art shown in FIG. 2, the worse case location for a block write was bit switches (BS248) 26 through bit switch (BS255) 23. These are the last eight bit switches located along the data lines 13 14. Thus all of the bit switch current from the block write has to flow through the bit line 13 14 resistance up to the connection of the last eight bit switches 26 23 in the prior art. In FIG. 6 the worse case logically distributed location of bit switches start at the thirty second physical location, (BS248) 42, with the remainder of the bit switches located physically every thirty-two positions, (BS249) 44, until the eighth and last bit switch of the block write (BS255) 23 is reached at the end of the data lines 13 14. All of the bit switch current now only needs to flow through the data line 13 14 resistance up to the thirty-second physical connected bit switch (BS 248) 42. Every thirty-two bit switch connections further down the data lines 13 14, the current flowing through the bit lines is reduced by the amount drawn by one bit switch. This results in a substantial reduction of voltage drop along the data lines 13 14 for a block write operation and allows for a faster block write performance.

Figure 7:
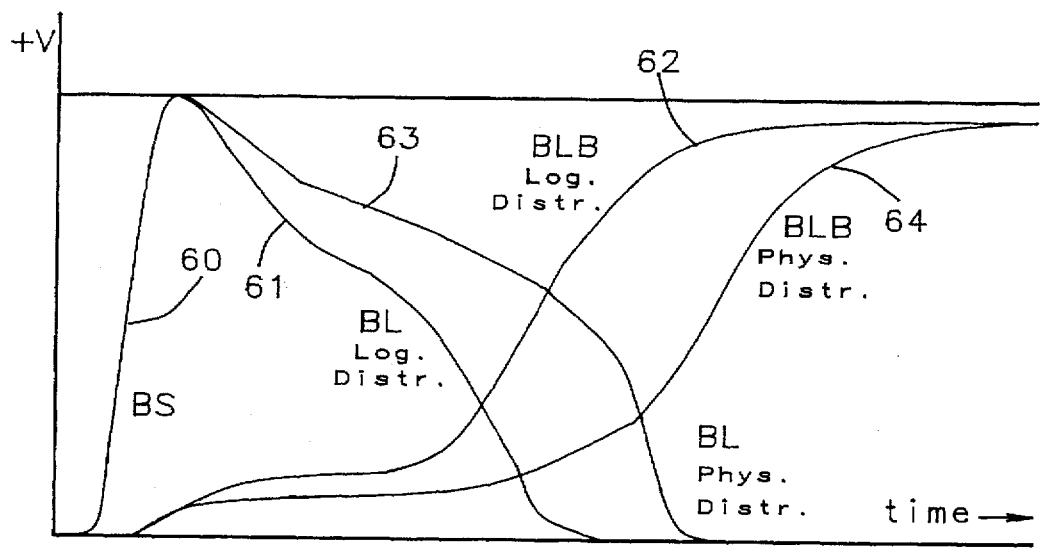
FIG. 7 shows the switching response of a bit switch in the worse case bit switch location, before and after logically distributing the bit switches.

In FIG. 7 is shown the bit line voltage at the worse case block write location (BS255) 23. After the bit switch control signal (BS) 60 is connected to bit switch (S255) 17 from the addressing circuitry 10, the bit switch (BS255) 23 connects the voltages on the data lines 13 14 to bit line (BL255) 51 and bit line bar (BLB255) 52. Both the BL and BLB signals for bit switch (BS255) 23 are shown in FIG. 7 for both the physically distributed bit switches of the prior art 63 64 and the logically distributed bit switches of this invention 61 62. The bit line performance is much improved with the logically distributed bit switches 61 62. This is a direct result of reducing the data line voltage drop by distributing the eight logically consecutive bit switches for a block write such that their location on the data lines are not physically consecutive.

Figure 8:
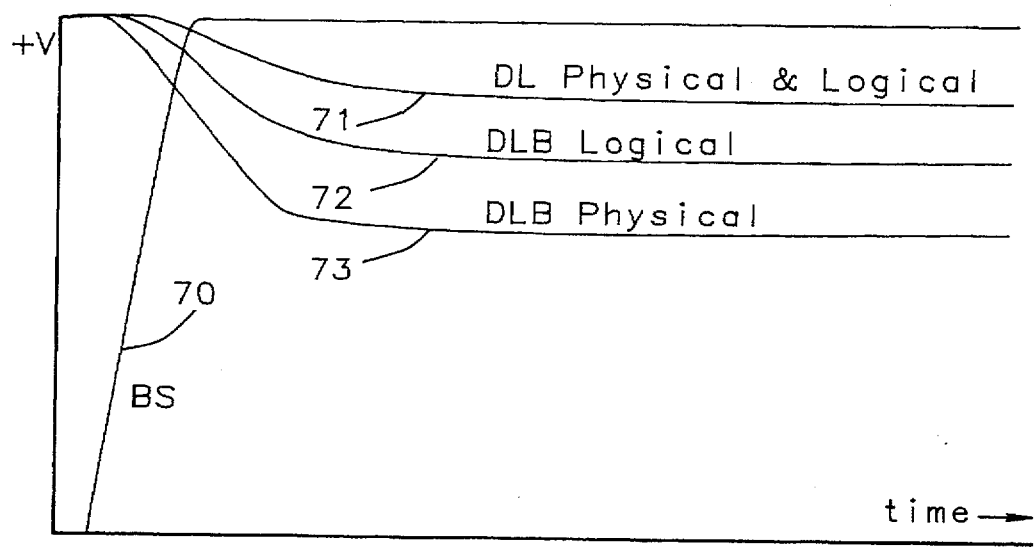
FIG. 8 shows data line voltages at the worse case bit switch location for a memory mask in a block write operation, before and after logically distributing the bit switches.

In FIG. 8 is shown the data line voltages under mask during block write. When a mask is set DL (data line) 13 and DLB (data line bar) 14 are maintained at a high voltage by the data line driver 21. After the bit switch control signal (BS) 70 is connected to bit switch (S255) 17 from the addressing circuitry 10, the data line voltages drops as a result of current flowing through the data lines into the bit lines. The voltages shown in FIG. 8 are at the worse case bit switch (BS255) 23. The DL voltage 71 drops slightly for both the physically and logically distributed bit switches because the BL (bit line) is in a high state. The DLB voltage 72 73 drops more because the BLB (bit line bar) is in a low state. The difference between the DLB voltage 72 and the DLB voltage 73 is the reduction in the voltage drop in the data lines between logically distributed and physically distributed bit switches. The DLB voltage 72 for the logical distribution of bit switches provides a more stable circuit with better noise margin.

While the invention has been particularly shown and described with reference to preferred embodiments thereof, it will be understood by those skilled in the art that various changes in form and details may be made without departing from the spirit and scope of the invention.

What is claimed is:

1. A distributed bit switch in a memory, comprising:
 a) a data input signal connected to data lines by a data line driver;
 b) bit switches connected between the data lines and memory columns;
 c) said data input signal connected to memory columns by means of said bit switches;
 d) a single data input signal connected simultaneously to several memory column locations by selecting several bit switches; and
 e) said bit switches connected logically in an interleave fashion along said data lines from a point near a data line driver to a point a distance from said data line driver.

2. The distributed bit switch of claim 1, wherein said bit switches connected logically in an interleave fashion along said data line are divided into "n" groups of equal numbers of bit switches, and wherein an equal number of bit switches is selected from each group to be connected to the single data input signal.

3. A distributed bit switch to improve performance by reducing the effects of data line resistance in a memory block write operation, and comprising:
 a) data input signal connected to data lines by a data line driver,
 b) bit switches connected between the data lines and memory columns, c) said data input signal connected to memory columns by means of said bit switches, d) a single data input signal connected simultaneously to several consecutive memory column locations by means of bit switches for a block write operation, e) said bit switches connected in physical order along data lines from a point near a data line driver to a far end point, f) each bit switch controlled on or off by means of memory addressing circuitry, g) a logical order of the bit switches determined by means of memory addressing circuitry, h) said bit switches selected in a logical order different than the physical order by addressing circuit means, i) several logically consecutive bit switches selected simultaneously by means of memory addressing circuitry to connect a single data input signal from the data lines to several consecutive memory columns to perform a block write operation, j) the logical order of the bit switches arranged such that no two physically consecutive bit switches can be selected as a part of a block write.

4. The distributed bit switch of claim 3, wherein a single data value can be connected simultaneously to eight logically consecutive memory columns to perform a block write, and comprising:

a) the logical order of bit switches arranged such that no two logically consecutive bit switches are within thirty-two physical connections of each other along data lines, b) the logical order of bit switches arranged such that no two physically consecutive bit switches are designated to be within eight logically consecutive bit switch addresses of each other along the data lines.

5. The distributed bit switch of claim 3, wherein the worse case location of logically ordered bit switches for a block write is closer to a bit line driver reducing data line resistance effects on bit line signal voltage, and comprising:

a) a data line to which is connected a large number of bit switches in physical sequence from a point near the bit line driver to a far end point, b) a worse case physical location of bit switches for a block write being the last eight bit switches connected to the data lines, c) a worse case logical location of bit switches for a block write being distributed over a range starting at the thirty-second physical bit switch and continuing every thirty-two bit switches there after until the last physical bit switch location is reached, d) the worse case logical location of bit switches for a block write being closer to the data line driver than the worse case physical location of bit switches, e) the worse case logical location of bit switches resulting in less voltage drop on data lines, leaving more voltage to charge line capacitance, and improve block write performance.

6. The distributed bit switch of claim 3, wherein a bit switch consists of two CMOS N-channel transistors, and comprising:

a) a first and a second CMOS N-channel transistor, b) the first and the second CMOS N-channel transistors each having a gate, a source and a drain, c) the gate of a first transistor connected to the gate of a second transistor, d) a switch control signal from memory addressing circuits connected to the gates of the first and second transistor, e) the source of the first transistor connected to DL (data line) of the data line driver, f) the source of the second transistor connected to DLB (data line bar) of the data line driver, g) the drain of the first transistor connected to a BL (bit line) of a memory column, h) the drain of the second transistor connected to a BLB (bit line bar) of a memory column, i) a positive switch control signal from the memory addressing circuits causing the first transistor and the second transistor to conduct, j) a conducting first transistor connects a signal on the DL to the BL, k) a conducting second transistor connects a signal on the DLB to the BLB, l) the absence of a switch control signal blocks a signal on DL from BL and a signal on DLB from BLB.

7. The distributed bit switches of claim 3, wherein the logical order of the bit switches are accomplished by means of logically ordered physical connections between memory addressing circuitry and the bit switches that are physically distributed along the data lines.

8. The distributed bit switches of claim 3, wherein the data line is designed to physically distribute the bit switches in other than a serial fashion, reducing data line voltage drop and improving block write performance.

9. The distributed bit switches of claim 8, wherein logical addressing along with any physical distribution of the bit switches reduces the data line voltage drop and improves block write performance.

10. The distributed bit switch of claim 3, wherein said block write is a mask block write.

11. A distributed bit switch for memory block write operations, and comprising:

a) a number of bit switches, each connecting data lines to bit lines of different memory columns, b) said data lines connected to a data line driver, c) said data line driver connecting a data input signal to said data lines, d) each bit switch activated by a signal from memory addressing circuitry, e) each bit switch when activated connecting a data signal on the data lines to different memory bit lines, f) each set of memory bit lines connecting to different memory columns, g) said bit switches grouped into "n" logical groups of "m" bit switches where n times m equals a total number of bit switches, h) each logical group containing one bit switch located within a first "n" bit switches physically connected to the data lines closest to the bit line driver, i) each logical group connected to the data lines in sequence starting with a first logical group containing a first bit switch physically closest to the data line driver, j) each subsequent logical group of bit switches starting with a next physically closest bit switch to the data line driver, k) each additional bit switch included within each group located "n" physical bit switch locations further from the data line driver than the previous bit switch included in the group, l) memory addressing circuitry selecting "n" logically consecutive bit switches for a memory block write operation by selecting one bit switch from each group.

12. The distributed bit switch for memory block write operations of claim 11, wherein the memory block write operation is a mask block write.

13. The distributed bit switch for memory block write operations of claim 11, wherein a memory block write connects the same data from the data lines to "n" logically consecutive memory columns by means of "n" logically consecutive bit switches.

14. The distributed bit switch for memory block write operations of claim 11, wherein "n" is eight bit switch groups and "m" is thirty-two bit switches included in each group.

15. The distributed bit switch for memory block write operations of claim 11, wherein the "n" groups of bit switches are sequentially ordered along the data lines starting with the first group containing the bit switch physically closest to the data line driver and ending with the last group containing a first bit switch which is physically connected to the data lines "n" bit switch locations from the data line driver.

16. The distributed bit switch for memory block write operations of claim 15, wherein the data line voltage drop between the data line driver and the worse case bit switch is reduced by the logical ordering of the bit switches, providing a larger voltage to charge line capacitance, and in turn improving the performance of the memory block write operation.

17. A logical interleave of bit switch addresses to prevent a physical clustering during a memory block write, to reduce data line voltage drop, to improve block write performance and to increase signal noise margin, and comprising:

a) a memory addressing signal connected to memory column bit switches, b) said bit switches used to connect a signal on a data line to memory columns, c) several logically consecutive bit switches simultaneously connect a single data line signal to several logically consecutive memory columns during a block write, d) said memory addressing signal connected to bit switches in a fashion to interleave bit switch addresses, e) said interleave of bit switch addresses activating bit switches for a block write along the data line in a distributed fashion, f) said distributed fashion producing a reduced data line voltage drop for a block write operation, g) said reduced data line voltage drop providing additional voltage to charge data line capacitance and improving signal noise margin.

18. The logical interleave of bit switch addresses of claim 17, wherein a block write of "n" bit switches requires "n" interleaves of the bit switch addresses to insure physically separation of active bit switches.

19. The logical interleave of bit switch addresses of claim 17, wherein each interleave contains a number of bit switch addresses in which the bit switches are physically separated on the data lines by a number of bit switch locations equal to the number of interleaves.

20. The logical interleave of bit switch addresses of claim 17, wherein the block write is a mask block write.

* * * * *